(12) United States Patent
Husby

(10) Patent No.: US 6,282,942 B1
(45) Date of Patent: Sep. 4, 2001

(54) CRASH SENSOR WITH MAGNETIC FIELD SENSOR

(75) Inventor: Harald S. Husby, Lakeland, FL (US)

(73) Assignee: Breed Automotive Technology, Inc., Lakeland, FL (US)

( * ) Notice: Subject to any disclaimer, the term of this patent is extended or adjusted under 35 U.S.C. 154(b) by 0 days.

(21) Appl. No.: 09/487,987

(22) Filed: Jan. 19, 2000

(51) Int. Cl.$^7$ ................................................ G01M 7/00
(52) U.S. Cl. .................... 73/12.04; 73/488; 200/61.45
(58) Field of Search ........................ 73/12.01, 12.04, 73/488; 200/61.45

(56) References Cited

U.S. PATENT DOCUMENTS

| | | | |
|---|---|---|---|
| 3,974,350 | 8/1976 | Breed | 200/61.53 |
| 4,284,863 | 8/1981 | Breed | 200/61.53 |
| 4,329,549 | 5/1982 | Breed | 200/61.45 |
| 4,900,880 | * 2/1990 | Breed | 200/61.45 |
| 5,031,931 | 7/1991 | Thuen et al. | 280/735 |
| 5,153,392 | 10/1992 | Husby et al. | 200/64.45 |
| 5,153,393 | * 10/1992 | Breed et al. | 200/61.45 |
| 5,237,134 | * 8/1993 | Thuen et al. | 200/61.45 |
| 5,430,334 | 7/1995 | Meister | 307/10.1 |
| 5,608,270 | 3/1997 | Meister | 307/10.1 |
| 5,856,645 | 1/1999 | Norton | 200/61.53 |
| 5,895,071 | 4/1999 | Norton | 280/735 |
| 5,984,350 | * 11/1999 | Hagan et al. | 280/735 |

* cited by examiner

*Primary Examiner*—Max Noori
(74) *Attorney, Agent, or Firm*—Lonnie Drayer; Patrick Steinnon

(57) ABSTRACT

A crash sensor comprising a magnetic field sensor with means for concentrating magnetic flux from the magnet, wherein the magnetic field sensor detects a change in magnetic field strength as the sensing mass moves causing a corresponding change in output voltage or current from the magnetic field sensor. The magnetic field sensor is used for determining crash severity for timely deployment of an occupant restraint system.

1 Claim, 3 Drawing Sheets

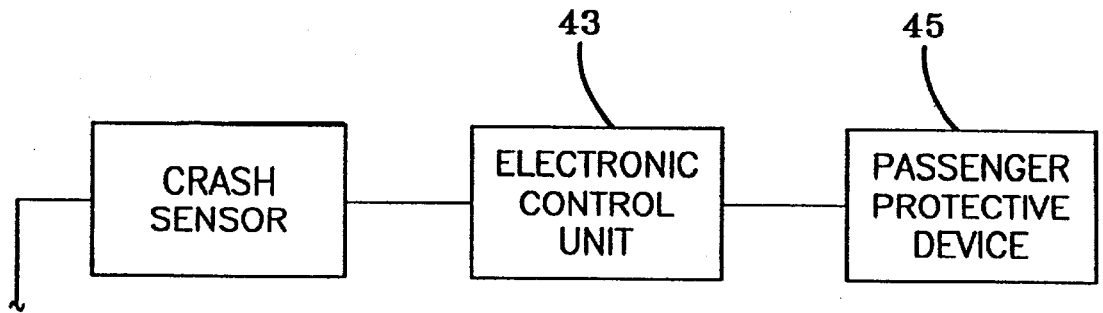
Prior Art  FIG-1
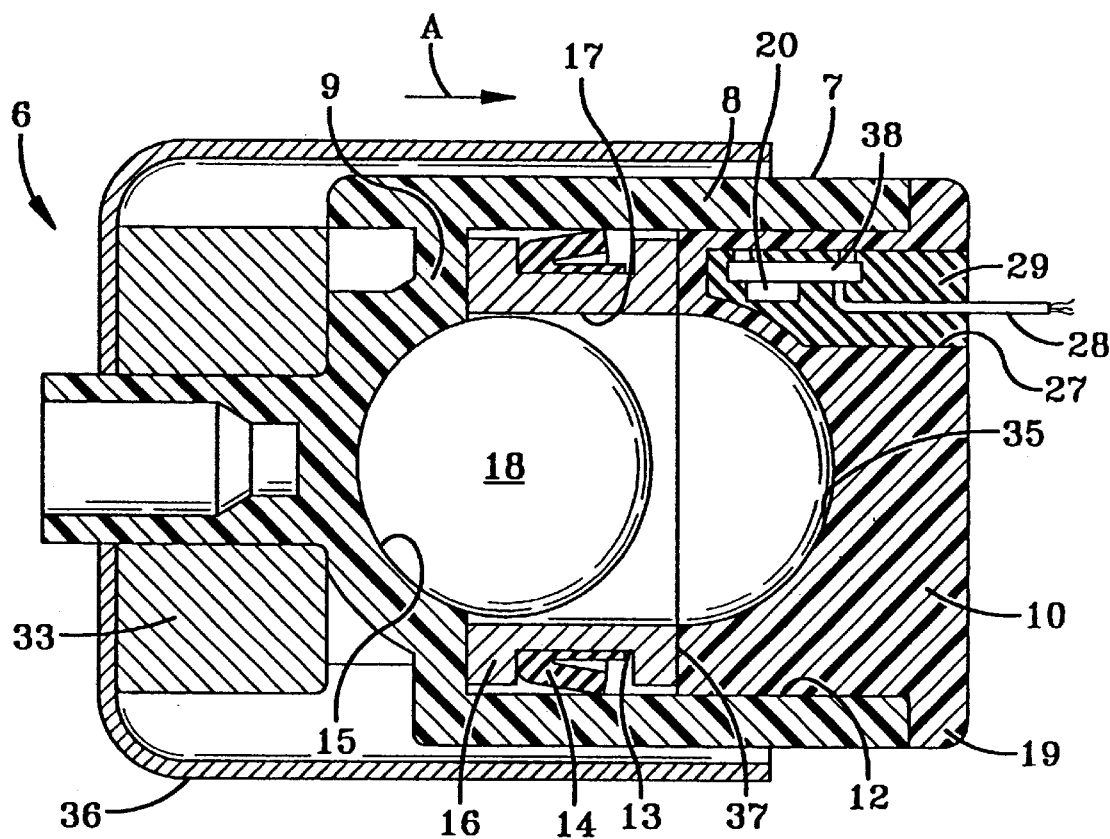
FIG-2

CRASH SENSOR WITH MAGNETIC FIELD SENSOR

TECHNICAL FIELD

The present invention relates to a crash sensor for mounting in motor vehicles for sensing a crash, the sensor generating a signal, which is used by the Electronic Control Unit for deploying a passenger restraint system such as an air bag.

BACKGROUND OF THE INVENTION

Crash sensors have become widely adopted by many of the world's automobile manufacturers to sense that a crash is in progress and initiate the inflation of an air bag or tension of seat belts. These sensors may be electromechanical and constructed from a ball and tube such as disclosed in U.S. Pat. Nos. 5,031,931 and 5,237,134 to Thuen; and U.S. Pat. No. 152,392 to Husby. The ball-in-tube sensor currently in widespread use has a magnetic bias.

In the conventional ball-in-tube sensor, two cantilevered contacts are bridged by the ball and both the ball and the contacts may be gold plated to minimize the contact resistance. If the sensing mass instead of bridging the contacts, provides a varying magnetic field directly related to the sensing mass position to the Magnetic Field Sensor, the gold plating on the ball as well as the contacts themselves can be eliminated.

In U.S. Pat. No. 5,608,270, Meister discloses an impact sensor using a cylindrical permanent magnet axially slidable within a cavity and a magnetic sensing means adjacent the cavity. In the Meister sensor the vehicle impact forces cause the magnet to slide toward the opposite end and the magnetic sensing means provides an electrical impact signal that varies in magnitude as a function of the axial position of the magnet within the cavity. The Meister patent does not disclose a gas damped ball-in-tube sensor using a ferromagnetic sensing means.

OBJECTIVES AND SUMMARY OF THE INVENTION

An accelerometer or crash sensor according to the invention is adapted for installation on an automotive vehicle equipped with a passenger protective device such as an inflatable air bag or seat belt tensioner. When such vehicle is subjected to deceleration of the kind accompanying a crash, the air bag is inflated to provide a protective cushion for the occupant or the seat belt is pulled back against the QQsupant holding him in a safe position.

A sensor constructed according to the invention comprises a housing adapted to be mounted on the vehicle in a position to sense and respond to deceleration pulses. Within the housing is a body containing a tubular passage in which is mounted a movable deceleration sensing mass. The mass is movable in response to a deceleration pulse above a threshold value bias from an initial position along a path leading towards a Magnetic Field Sensor that is connected via suitable wiring to the operating mechanism of an inflatable air bag or seat belt tensioner.

A biasing spring or magnet acts on the deceleration sensing mass to bias the later to its initial position under a preselected force, which must be exceeded before the sensing mass, may move from its initial position. When the sensing mass is subjected to a deceleration creating an inertial force greater than the preselected biasing force it moves from its initial position toward its air bag or seat belt tensioner operating position. Movement of the sensing mass is fluid damped thereby requiring a finite period of time for the sensing mass to move from its initial position to its operating position.

It is another objective of this invention to utilize the magnetic field, which is present in a magnetically biased sensor to provide the means to monitor the position of the sensing mass in real time, thus enabling the airbag electronic control unit (ECU) to calculate sensing mass velocity and direction of motion. This information can be used to optimize deployment timing as well as deployment force (airbag pressure vs. time).

It is another objective of this invention to provide the means to calculate or predict the severity of a crash early in the event to further optimize deployment timing.

It is another objective of this invention to utilize a spring as a biasing force against the ball. This will eliminate the effect of temperature on the bias force. A smaller magnet must then be added to provide the desired variation of the magnetic field reaching the Magnetic Field Sensor.

Other objectives and advantages will become apparent from the description of the preferred embodiments below.

BRIEF DESCRIPTION OF THE DRAWINGS

A crash sensor constructed in accordance with the preferred embodiments of the invention is illustrated in the accompanying drawings, wherein:

FIG. 1 shows a schematic diagram for a typical passenger restraint system;

FIG. 2 is a sectional view of the preferred embodiment of a crash sensor with a magnetic field sensor;

DETAILED DESCRIPTION OF THE PREFERRED EMBODIMENTS

Figure 3:
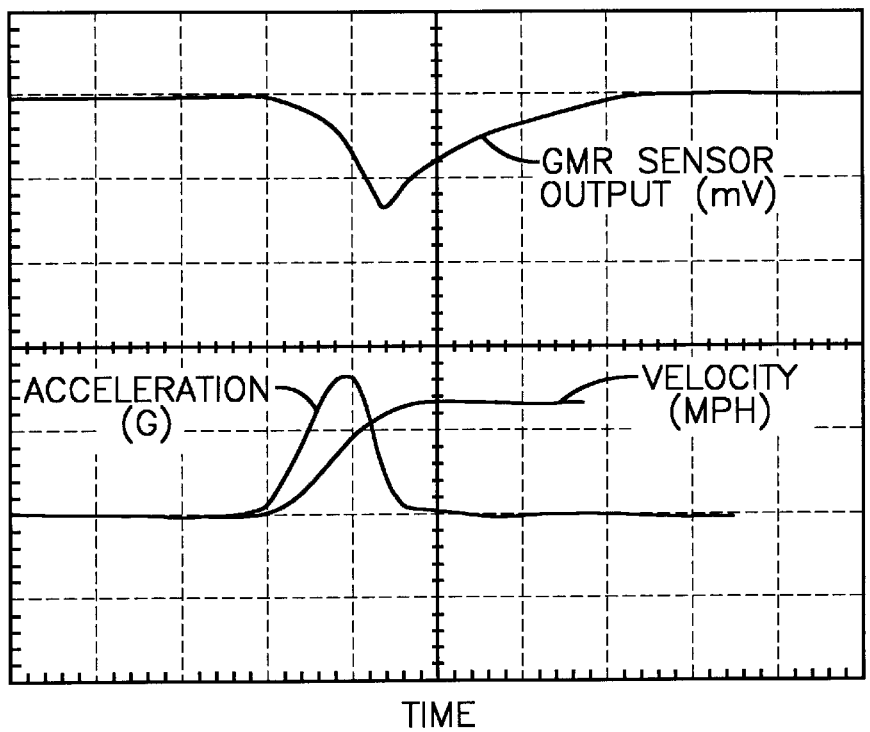
FIG. 3 shows the operation of the crash sensor of FIG. 2 with a GMR sensor.

An apparatus constructed in accordance with the invention is illustrated in FIG. 2 and is adapted for use in conjunction with an automotive vehicle or truck (not shown) preferably accommodated within a closed, metallic housing (not shown).

The crash sensor is designated generally by reference 6 in FIG. 2, and comprises a body 7 formed of suitable plastic material and having a cylindrical portion 8 closed at one end by a wall 9. At the other end of the body is a closing plug 10. Within the cylindrical portion 8 there is a bore 12. The inner surface of the cylindrical portion 8 is provided with a first end 15 and a second end 35, comprising two semi-spherical, concave seats. Although in the preferred embodiment these ends are semi-spherical, concave seats, other configurations may be used such as rectangular, cylindrical, triangular, et. Fitted into the bore 12 is a metallic sleeve 16 having a smooth inner surface forming a linear passage 17 and on the outer diameter midway along the sleeve is groove 13 in which is accommodated a rubbery sealing and vibration isolating ring 14 which also holds the sleeve in place.

The closing plug 10 comprises a flat surface 37 to support the metallic sleeve 16 and the concave seat 35, which forms the second end of the cylindrical portion. The plug 10 comprises a shoulder 19, which rests on and may be glued, welded, or otherwise attached to the body 7. A cavity 27 is provided in the shoulder 19 to accommodate a magnetic sensor 20, a printed circuit board 38, and a wire assembly 28. The magnetic sensor 20 and its associated wire assembly 28 and printed circuit board 38 may be secured by an encapsulating material 29. In the preferred embodiment the magnetic sensor is located adjacent the second end 35 of the passage. However, it will be appreciated by a person skilled in the art that the magnetic sensor may be positioned in other locations in the sensor, including between the second end 35 and the shoulder 19.

In the preferred embodiment, accommodated within the passage 17 is a spherical, magnetically permeable, sensing mass 18, the radius of which corresponds substantially to that of the seats 15, 35 and the diameter of which is slightly less than that of the passage 17. Although the sensing mass is preferably spherical, other configurations may be used such as rectangular and cylindrical. Sliding friction tends to amplify the effect of cross axis accelerations, which are present in every crash. Expensive manufacturing processes and/or friction reducing coatings are generally required to obtain reliable performance to reduce the effects of sliding friction, especially if the sensor is mounted in the Crush Zone. However, using a spherical sensing mass minimizes the concern for sliding friction. Friction reducing coatings are well known and may be applied to the passage 17 and/or the sensing mass 18 by spraying, dipping, impregnating, or other methods. One example of a coating material is Teflon.

Means are provided for applying magnetic biasing force on the mass 18 and comprise a magnet 33 and a magnetic field director 36. The magnet 33 will exert a magnetically attractive force on the sensing mass 18 so as to normally retain the latter in an initial, inactive position on the first end 15 of the passage 17. Any magnet material may be used for the magnet 33. However, in the preferred embodiment Alnico was used due to its temperature characteristics. The magnetically permeable field director 36 provides an extended biasing force when the mass 18 is moving away from the magnet 33.

If the vehicle on which the sensor is mounted is traveling in the direction of arrow A (FIG. 2), the sensing mass 18 will remain in its position until such time as the vehicle experiences a deceleration pulse greater than the biasing force exerted on the mass 18 by the magnet 44. If such deceleration pulse is of sufficient magnitude and duration, the sensing mass 18 will move from the first end of the passage 15 as shown in FIG. 2 toward the second end 35 of the passage.

A magnetic field sensor 20 is positioned adjacent the second end 35 of the passage 17 with means for concentrating magnetic flux 36 from said magnet 33. In the preferred embodiment the flux concentration means 36 is a magnetically permeable field director, which channels magnetic flux from the sensing mass 18 to the magnetic field sensor 20. During operation as the sensing mass 18 moves toward the second end 35, the magnetic field sensor 20 detects a change in magnetic field strength causing a corresponding change in output voltage or current from the magnetic field sensor 20. The magnetic field sensor 20 sends a voltage or current signal to an Electronic Control Unit (ECU) 43 that triggers the passenger protective device 45 if conditions exceed a predetermined threshold. The ECU 43 may combine the signal from the magnetic field sensor 20 with signals from other sensors to determine activation timing, sequence, or aggressiveness of the restraint devices.

The magnetic field sensor 20, which preferably is a Giant Magnetoresistive sensor (GMR), may also be an Anisotropic magnetoresistive sensor (AMR) or a Hall Effect sensor. An example of a GMR sensor is Nonvolatile Electronics' AA005-02. The magnetic field sensor 20 is contained in a package mounted on a printed circuit board 38. Signal and power conditioning electronics if needed may be contained in an Application Specific Integrated Circuit (ASIC) and may be mounted on the printed circuit board 38, or may be packaged with the magnetic field sensor 20 as a single chip.

In the preferred embodiment of this invention, the sensing mass 18 resides in a closed chamber formed by ends 15, 35 and the passage 17. The movement of the ball/sensing mass 18 is damped by fluid, either a gas or a liquid, flowing through the annular orifice created by the passage 17 and the sensing mass 18, creating a damped crash sensor. Although the preferred embodiment is a gas damped crash sensor, an undamped crash sensor with a magnetic field sensor may also be used. In addition, contacts may be added to the second end of the preferred embodiment. There are many types of contacts that may be used in conjunction with the Magnetic Field sensor, including contacts disclosed in U.S. Pat. Nos. 5,237,134 to Thuen; 5,895,071 to Norton; and 5,011,182 to Husby. In many crash scenarios, the magnetic field sensor would send a signal to the ECU causing the ECU to deploy the passenger restraint system before the sensing mass would reach the contacts. Thus, the contact system would serve as a backup means for deploying the passenger restraint system or signal the ECU that a preset sensing mass travel has been reached.

To condition the apparatus for operation, the sensor mechanism is fitted into the housing and the latter is fixed to a vehicle with the longitudinal axis of the passage 17 parallel or at a predetermined angle to the longitudinal axis of the vehicle. The sensor may be positioned in the crush zone of the vehicle or the passenger compartment, or another suitable location on the vehicle.

FIG. 3 shows a graph of the GMR sensor output during deceleration in a laboratory test with the embodiment shown in FIG. 2. The voltage output is in response to the position of the sensing mass 18, which in turn relates to the velocity change of the sensor in a damped crash sensor. If the crash sensor is undamped, the position of the sensing mass 18 relates to the deceleration of the sensor. In the damped crash sensor, the slope of the voltage versus time curve is indicative of the velocity of the sensing mass and hence, can be related to the severity of the crash, The slope increases as the severity of the crash increases. Also, in the damped sensor the position of the sensing mass relates directly to the total velocity change of the sensor at any time during the crash. Thus, the position and velocity of the sensing mass 18 at some predetermined threshold may cause the ECU to trigger the air bag, the seat belt tensioner, or other safety devices.

Figure 5:
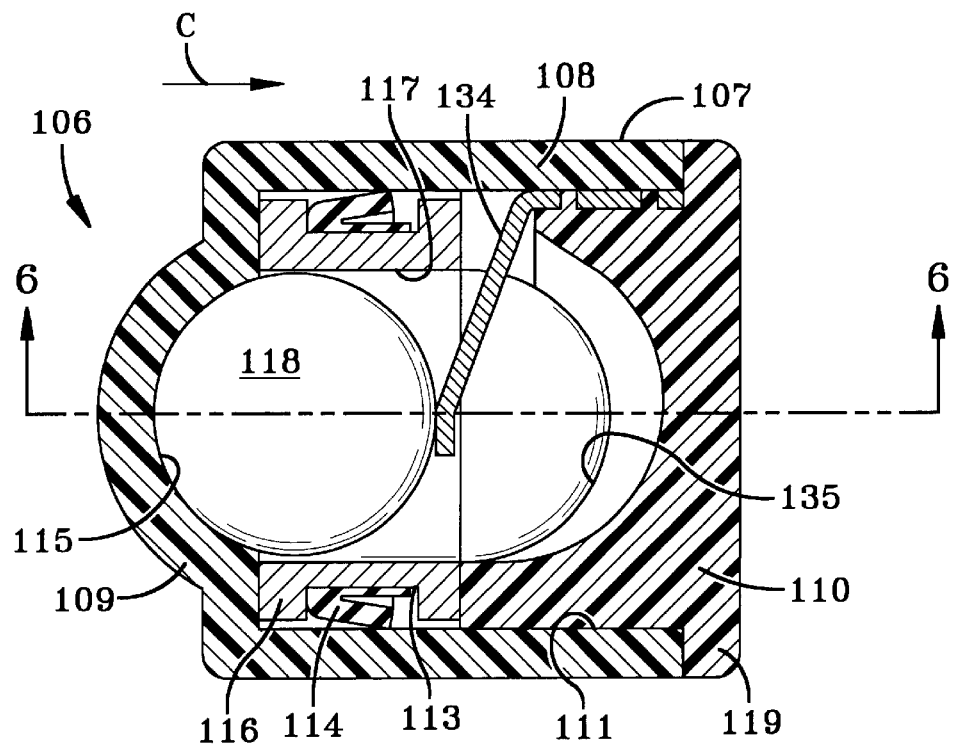
FIG. 5 is a sectional view of another embodiment of the gas damped crash sensor with a spring as a biasing force and a magnetic field sensor.
Figure 6:
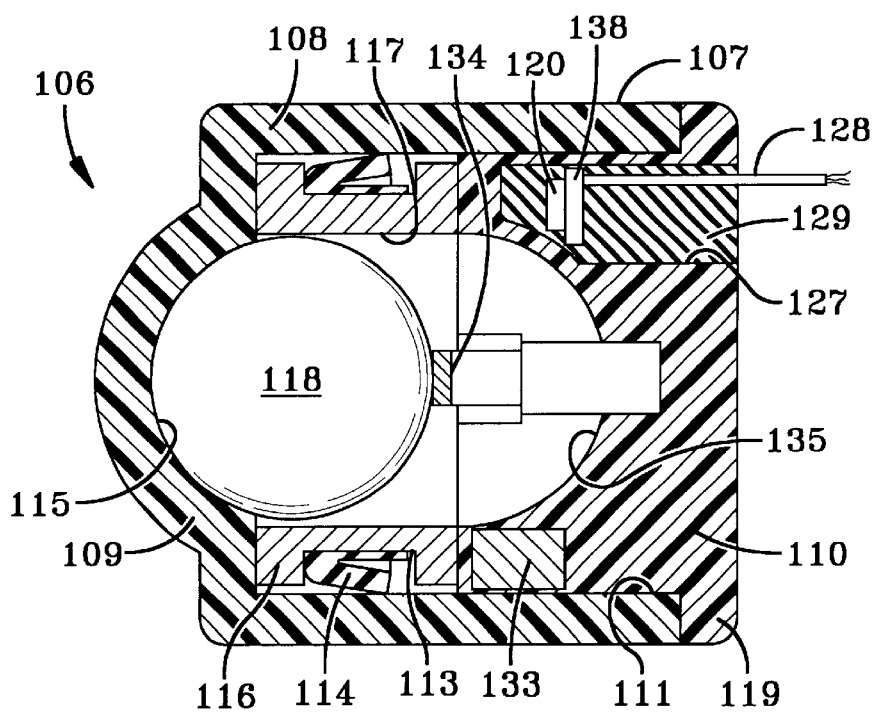
FIG. 6 is a sectional view of the embodiment of the gas damped crash sensor of FIG. 5 taken along lines 6—6.

FIGS. 5 and 6 show another embodiment of the gas damped crash sensor. This embodiment uses a flexible extension 134 as a biasing force rather than a magnet. The crash sensor is designated generally by reference 106 in FIGS. 5 and 6, and comprises a body 107 formed of suitable plastic material and having a cylindrical portion 108 closed at one end by a wall 109. At the other end of the body 107 is a cylinder skirt 110. Within the cylindrical portion 108 there is a bore 111. The inner surface of the portion 108 is provided with a first end 115 and a second end 135, comprising two opposed semi-spherical, concave seats. Fitted into the bore 111 is a metallic sleeve 116 having a smooth inner surface forming a linear passage 117 and on the outer diameter midway along the sleeve 116 is a groove 113 in which is accommodated a rubbery sealing and vibration isolating ring 114, which also holds the sleeve 116 in place.

Fixed in the bore 111 is a cylindrical plug 119, which is attached to the bore in any suitable manner, such as welding, gluing, or crimping. A cavity 127 is provided in the plug 119 to accommodate a magnetic sensor 120, a printed circuit board 138, and a wire assembly 128. The magnetic sensor 120 and its associated wire assembly 128 and printed circuit board 138 may be secured by an encapsulating material 129. In a preferred embodiment the magnetic sensor 120 is located adjacent the second end 135 of the passage. However, it will be appreciated by a person skilled in the art that the magnetic sensor 120 may be positioned in other locations in the sensor, including between the second end 135 and the shoulder 119. The magnetic field sensor 120, which preferably is a Giant Magnetoresistive sensor (GMR), may also be an Anisotropic magnetoresistive sensor (AMR) or a Hall Effect sensor.

In this embodiment, accommodated within the passage 117 is a spherical, magnetically permeable, sensing mass 118, the radius of which corresponds substantially to that of the seats 115, 135 and the diameter of which is slightly less than that of the passage 117. Although the sensing mass is preferably spherical, other configurations may be used such as rectangular, and cylindrical. Using a spherical sensing mass minimizes the concern for sliding friction. Friction reducing coatings, such as a wet/dry lubricant, may be applied to the passage 117 and/or the sensing mass 118.

During operation, the flexible extension or spring 134 presses on a sensing mass 118 providing the necessary bias. During a crash, the sensing mass 118 moves toward the front of the vehicle to the right in FIG. 5, but its motion is opposed by the spring biasing force and a difference in pressure across the ball. This pressure differential is gradually relieved by the flow of the fluid through the clearance between the sensing mass 118 and the cylinder. If the vehicle on which the sensor is mounted is traveling in the direction of arrow C (FIG. 5) the sensing mass 118 will remain in its position until such time as the vehicle experiences a deceleration pulse greater than the biasing force exerted on the mass 118 by the spring 134. If such deceleration pulse is of sufficient magnitude and duration, the sensing mass 118 will move from the first end of the passage 115 toward the second end 135 of the passage.

A magnet 133 is positioned within the crash sensor and provides a magnetic force. Any magnet material may be used, but in this embodiment Alnico was used for its temperature characteristics. In this embodiment, the magnet is positioned adjacent the second end 135 of the passage 17 opposite the magnetic field sensor 120. A person skilled in the art will appreciate that the magnet may be located in other positions in the sensor. In this embodiment, the crash sensor may also include means for concentrating magnetic flux (not shown) from said magnet 133. During operation as the sensing mass 118 moves toward the second end 135, the magnetic field sensor 120 detects a change in magnetic field strength causing a corresponding change in output voltage or current from the magnetic field sensor 120. The magnetic field sensor 120 sends a voltage or current signal to an Electronic Control Unit (ECU) 43 that triggers the passenger protective device 45 if conditions exceed a predetermined threshold. The ECU 43 may combine the signal from the magnetic field sensor 120 with signals from other sensors to determine activation timing, sequence, or aggressiveness of the restraint devices.

Figure 4:
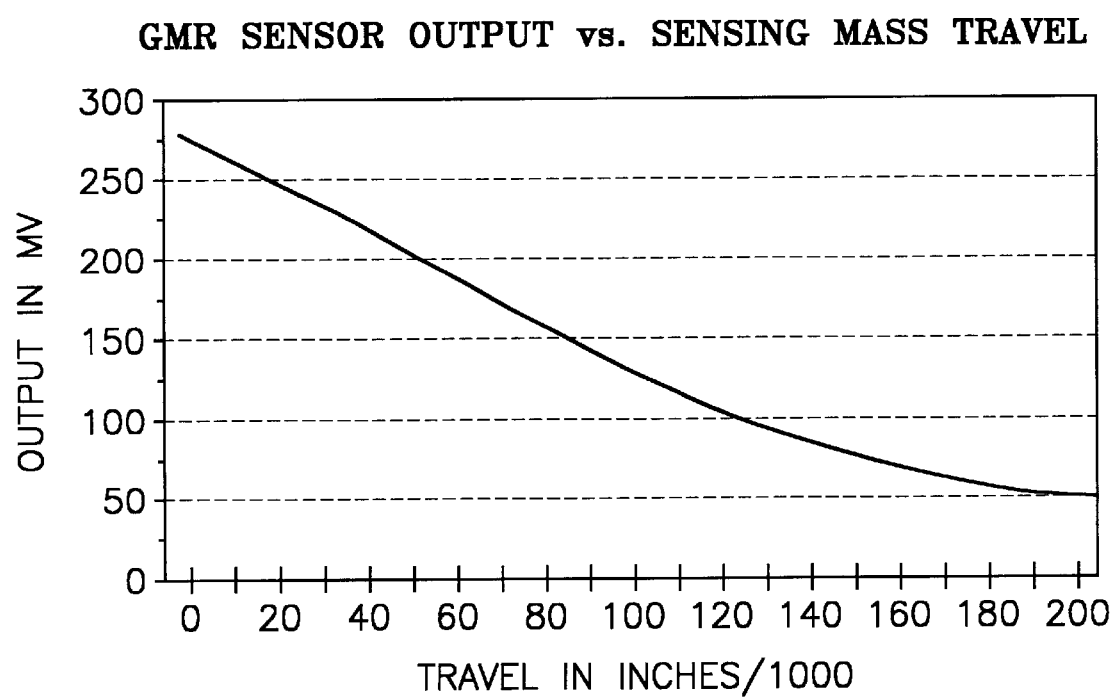
FIG. 4 shows a static test of the crash sensor of FIGS. 5 and 6.

FIG. 4 shows a graph of the crash sensor of FIGS. 5 and 6 with a GMR sensor. The graph shows the GMR sensor output versus sensing mass travel in a static bench test. The nonlinearity of the curve may be corrected by the ECU.

This invention is particularly useful when the crash sensor is placed in the crush zone of the vehicle. The crush zone is that portion of the vehicle which undergoes significant plastic deformation during the accident and where both longitudinal and cross axis vibrations are of significant magnitude and can seriously effect the sensor behavior in marginal crashes.

The crash sensor as described herein may be used for detecting crash severity and/or for deploying a passenger restraint system. As a crash severity detector, the sensor may be positioned in the crush zone of the vehicle, in conjunction with a sensor deploying the passenger restraint system generally located in the ECU in the passenger compartment. In addition to the crush zone, the sensor can also be located in the passenger compartment or other suitable location in the vehicle. The sensor as a crash severity detector either confirms a crash detected by the ECU or sends a signal to the passenger restraint ECU prior to its crash detection, thus allowing for earlier deployment of the passenger restraint system. The sensor can also be used alone as a crash detection sensor, whereas it sends a signal to ECU for deployment of the passenger restraint system if conditions exceed a predetermined threshold. Either one or a plurality of sensors may be placed in the vehicle depending on the requirements. Or as indicated above, the present sensor can be used in conjunction with another crash sensor, such as an electronic sensor or an electromechanical sensor.

Although some preferred embodiments have been disclosed and described in detailed herein it should be understood that this invention is in no sense limited thereby and its scope is to be determined by that of the appended claims.

What is claimed is:

1. A crash sensor for sensing velocity changes comprising:

(a) a tubular passage having a first end and a second end;

(b) a magnetically permeable sensing mass which is a ball, arranged to move in said passage between the first end and the second end of the passage;

(c) a fluid located in the passage for dampening the movement of the sensing mass, wherein a tight clearance is provided between said sensing mass and said tubular passage and said tubular passage is substantially closed;

(d) a magnet, positioned about said second end of the passage;

(e) a flexible member in the passage for biasing said sensing mass toward said first end of the passage; and (f) a magnetic field sensor, positioned about the second end of the passage, and spaced from the magnet wherein as said sensing mass moves towards said second end, the change in magnetic field reaching the magnetic field sensor causes a corresponding change in output voltage or current from the magnetic field sensor.

\* \* \* \* \*